United States Patent [19]
Gwinn

[11] Patent Number: 5,962,858
[45] Date of Patent: Oct. 5, 1999

[54] METHOD OF IMPLANTING LOW DOSES OF IONS INTO A SUBSTRATE

[75] Inventor: Matthew C. Gwinn, Salem, Mass.

[73] Assignee: Eaton Corporation, Beverly, Mass.

[21] Appl. No.: 08/891,415

[22] Filed: Jul. 10, 1997

[51] Int. Cl.⁶ ............................................... H01J 37/317
[52] U.S. Cl. ...................................................... 250/492.21
[58] Field of Search ........................................ 250/492.21

[56] References Cited

U.S. PATENT DOCUMENTS

| | | | |
|---|---|---|---|
| 3,916,034 | 10/1975 | Tsuchimoto | 427/38 |
| 3,924,134 | 12/1975 | Uman et al. | 250/423 |
| 4,775,818 | 10/1988 | Clark, Jr. et al. | 313/230 |
| 4,881,010 | 11/1989 | Jetter | 250/492.21 |
| 4,988,640 | 1/1991 | Bohling et al. | 437/81 |
| 5,558,718 | 9/1996 | Leung | 250/492.2 |

*Primary Examiner*—Jack I. Berman
*Attorney, Agent, or Firm*—Lahive & Cockfield, LLP; Anthony A. Laurentano

[57] ABSTRACT

The present invention provides for an ion implantation system that employs an ion source for ionizing and implanting into a substrate a noble diluent gas and a particular dopant gas. The noble diluent gas of the present invention preferably does not react with the dopant gas, or with dopant residue which coats the walls of the ionization chamber of the ion source, thus allowing the ion source to be used for accurate, stable low dose implants. Additionally, the noble diluent gas does not introduce conductivity altering ions, or impurities, into the substrate S. Consequently, the dosage of the dopant ions implanted into the substrate can be precisely controlled, especially in low dose applications.

19 Claims, 3 Drawing Sheets

Varied PH$_3$ Concentration at Constant Set Power - Dilution in Helium

| | Net Forward RF Power (watts) | He$_3$ Flow (sccm) | PH$_3$ Flow (sccm) | Resulting PH$_3$ Concentration (%) | Dopant Fraction (%) | Linear Beam Current Density @80 keV (μA/cm) | Total Beam Current (mA) | Dopant Current @ 80keV (part-μA/cm) | P$_2$H$_x$/PH$_x$ (%) |
|---|---|---|---|---|---|---|---|---|---|
| 1 | 1307.9 | 73.2 | 0.0 | 0.00 | 0.0 | | 12.6 | 0.00 | 0.0 |
| 2 | 1257.7 | 71.5 | 0.4 | 0.56 | 0.0 | 252 | | 0.00 | 0.0 |
| 3 | 1248.4 | 71.5 | 0.7 | 0.97 | 1.6 | 248 | 12.4 | 3.97 | 0.0 |
| 4 | 1266.5 | 69.4 | 1.4 | 1.98 | 3.6 | 362 | 18.1 | 13.03 | 0.0 |
| 5 | 1471.4 | 67.9 | 2.1 | 3.00 | 13.0 | 442 | 22.1 | 57.46 | 5.2 |
| 6 | 1546.5 | 66.5 | 2.8 | 4.04 | 16.0 | 503 | 25.15 | 80.48 | 7.3 |
| 7 | Missing Data Point | 65.0 | 3.5 | 5.11 | 21.0 | 556 | 27.8 | 116.76 | 8.3 |
| 8 | 1551.1 | 61.4 | 5.3 | 7.95 | 31.0 | 610 | 30.5 | 189.10 | 10.8 |
| 9 | 1497.7 | 57.8 | 7.1 | 10.94 | 39.0 | 608 | 30.4 | 237.12 | 13.3 |

Fig. 2

METHOD OF IMPLANTING LOW DOSES OF IONS INTO A SUBSTRATE

BACKGROUND OF THE INVENTION

The present invention relates to ion sources and ion implantation systems for generating and implanting ions into a substrate, and more particularly, ion implantation systems that facilitate implantation of low doses of ions into a substrate.

Ion implantation has become a standard, commercially accepted technique for introducing conductivity-altering dopants into a substrate, such as a semiconductor wafer or thin film deposition on a glass substrate, in a controlled and rapid manner. Conventional ion implantation systems include an ion source that ionizes a desired dopant element which is then accelerated to form an ion beam of prescribed energy. This beam is directed at the surface of the substrate. Typically, the energetic ions of the ion beam penetrate into the bulk of the substrate and are embedded into the crystalline lattice of the material to form a region of desired conductivity. This ion implantation process is typically performed in a high vacuum, gas-tight process chamber which encases a workpiece handling assembly, a workpiece support assembly, and the ion source. This high vacuum environment prevents dispersion of the ion beam by collisions with gas molecules and also minimizes the risk of contamination of the substrate by airborne particulates.

In the ion source, a dopant gas, such as phosphine or boron, and a diluent gas, which is typically nitrogen or hydrogen, are ionized by an energized cathode to form an plasma. This plasma is accelerated by suitable electrodes through the ion source to form an ion beam, which is then introduced into the implantation chamber of the ion implantation system. The ions present in the ion beam impinge upon the substrate and are implanted therein.

A drawback of conventional ion sources and implantation systems is that the dopant gas typically coats the chamber walls of the ion source with a residue. The diluent gas when introduced into the ion source plasma chamber reacts with the residue coating and creates impurities increasing the effective concentration of dopant gas in the dilutant gas. This uncontrolled release of dopant into the plasma prevents control of the low dose implants. One method of avoiding the introduction of impurities into the implantation chamber would be to clean the residue from the walls of the ion source after each use. This methodology, however, is impractical since it results in a significant loss of service time of the ion source, with a corresponding decrease in throughput in the ion implantation system.

Although the impurities created by the reaction between the dopant residue and the diluent gas can typically be tolerated in high dose applications, there is an ever increasing demand for ion sources that implant low doses of ions into substrates. In such applications, rigid control over the constituency of the beam current and ions are necessary. The presence of impurities in the ion beam makes it difficult to control the ion dose being implanted in the substrate.

Hence, there still exists a need in the art for an ion source and implantation system that facilitates the implantation of low doses of ions into a substrate. In particular, an ion source that can be utilized regardless of the type of prior use, known generally as "source history," and without requiring frequent cleanings to remove residue would represent a major improvement in the art.

The invention will next be described in connection with certain preferred embodiments. However, it should be clear that various changes and modifications can be made by those skilled in the art without departing from the spirit and scope of the invention. For example, various systems employing various system structural components that utilize the preferred practice of the invention can be employed to use a non-reactive diluent gas.

SUMMARY OF THE INVENTION

The present invention provides for an ion implantation system that employs an ion source for ionizing and implanting into a substrate a noble diluent gas and a particular dopant gas. The noble diluent gas of the present invention preferably does not react with the dopant gas, or with dopant residue which coats the walls of the ionization chamber of the ion source, thus allowing the ion source to be used for accurate, stable low dose implants. Additionally, the noble diluent gas does not introduce conductivity altering ions, or impurities, into the substrate S. Consequently, the dosage of the dopant ions implanted into the substrate can be precisely controlled, especially in low dose applications.

This invention attains the foregoing and other objects for ionizing a selected gas mixture in an ion source by introducing a dopant gas and a noble diluent gas, which intermingles with the dopant gas, into an ionization chamber of an ion source, and ionizing the dopant gas and the noble diluent gas. The ionized gases form energized dopant and diluent ions. The ions can then be implanted into a substrate.

According to one aspect, the noble diluent ions and the dopant ions are implanted into the substrate. According to another aspect, the noble diluent gas is helium, and the ion source is operated regardless of source history.

According to another aspect, relatively low doses of the ions are implanted within the substrate. As used herein, the term "low dose" is intended to include forming an ion beam having a dopant ion concentration in the range between about $1\times10^{11}$ cm$^{-2}$ and about $1\times10^{16}$ cm$^{-2}$.

According to still another aspect, the ion source is coupled to an implantation housing having an implantation chamber sized to house the substrate, and the substrate is implanted by discharging ions from the ion source, and impinging the ions upon the substrate.

Other general and more specific objects of the invention will in part be obvious and will in part be evident from the drawings and description which follow.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

FIG. 2 is a tabular representation of results achieved from utilizing helium as the diluent gas in the ion implantation system of FIG. 1.

DETAILED DESCRIPTION OF ILLUSTRATED EMBODIMENTS

The illustrated ion implantation system 10 employs an ion source 12 that ionizes a particular dopant gas and a diluent gas, such as a noble gas, and in particular helium. The diluent gas of the present invention preferably does not react with the dopant gas, or with dopant residue which coats the walls of the ionization chamber of the ion source, thus allowing the ion source to be used for accurate, stable low dose implants. This is a significant feature since ion sources which have been previously used, whether in high dose or low dose implants, are typically cleaned prior to use in low dose implantation applications. The present invention provides for use of a noble gas as a diluent gas, therefore eliminating the need for cleaning the ion source prior to use in low dose implant environments.

Figure 1:
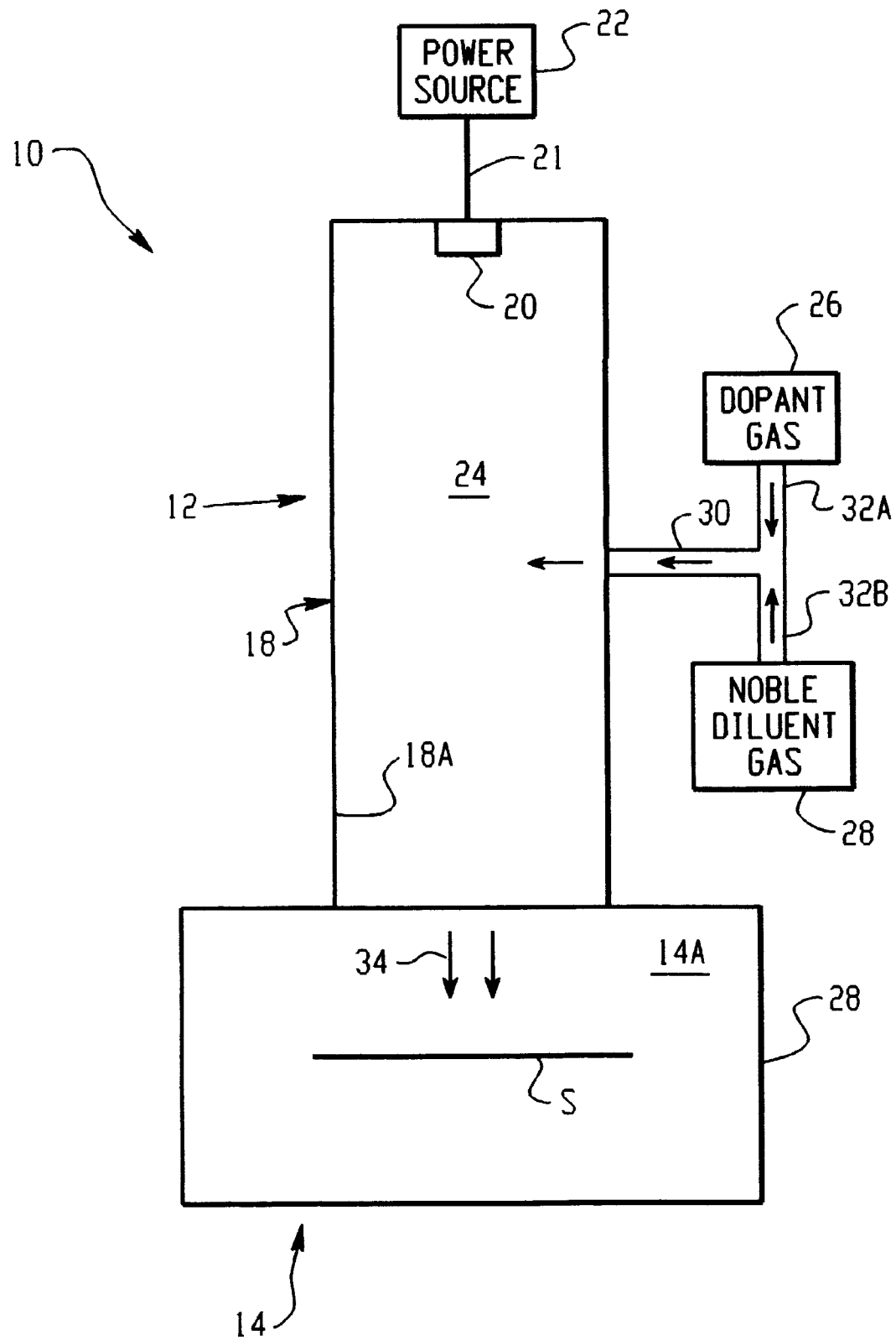
FIG. 1 is a schematic block diagrammatical depiction of an ion implantation system that employs a noble diluent gas according to the teachings of the present invention.

FIG. 1 illustrates in block diagrammatical form an ion implantation system 10 that includes an ion source 12, and an implantation housing 14 in communication with the ion source and which typically mounts a substrate S in an implantation chamber 14A. The illustrated ion source 12 generally emits an ion beam which impinges upon the substrate S to implant the substrate with selected ions. General ion implantation systems are known in the art, well characterized and are available commercially from Eaton Corporation, Cleveland, Ohio. The illustrated ion source can be any conventional ion source suitable for use in implanting substrates with selected ions. Ion sources of these types are well characterized and are available from Eaton Corporation, Cleveland, Ohio.

The illustrated ion source 12 can include standard components, and in particular includes a standard housing 18 that forms an ionization chamber 24. The ion source 12 further includes an energizing electrode 20, such as a cathode, which is coupled to a power source 22 via any suitable electrical connection, such as electrical lead 21. The ionization chamber 24 is coupled to a dopant gas reservoir 26 and a diluent gas reservoir via any suitable fluid network, such as by fluid conduits 30 and 32A–32B. The foregoing structure of the ion source, electrode, power source and fluid networks are known in the art, are commercially available, and their connections and operation will be apparent to those of ordinary skill in the art. For example, the energizing electrode 20 is energized by the power source 22 upon actuation. A selected dopant gas, such as boron or phosphorous, is housed within the dopant gas reservoir 26. This gas is introduced to the ionization chamber 24 via fluid conduits 32A and 30, and is ionized by the excited energizing electrode to form a plasma. A fluid regulator can be provided to regulate the amount of noble diluent gas and dopant gas introduced to the ionization chamber.

In a similar manner, the diluent gas is introduced into the ionization chamber, either prior to, simultaneously or contemporaneously, or after introduction of the dopant gas, such as by fluid conduits 32B and 30. The energizing electrode 20 also ionizes the diluent gas, which then forms part of the plasma. In particular, the diluent and dopant gases intermingle within the ionization chamber 24, and are ionized by the energizing electrode 20 to form dopant ions and diluent ions. These ions, which are present in the plasma, are accelerated through the ion source housing 18 and discharged at an output end of the source to form an ion beam of prescribed energy, e.g., current density.

The ion beam generated by the ion source 12 is introduced into a conventional implantation housing 28, which defines an implantation chamber 14A. A suitable substrate S to be implanted is positioned within the chamber 14A, such as by known substrate handling assemblies (not shown), and within the path of the ion beam emerging from the ion source 12, illustrated by arrows 30. The energetic ions which form part of the ion beam 30 strike the substrate S and penetrate into its bulk, thereby introducing conductivity altering dopant ions, as well as diluent ions, into the substrate.

The diluent gas is intermingled with the dopant gas to form a plasma once ionized by the ion source 12. The ionized diluent gas portion of the plasma helps maintain a suitable pressure within the ion source to achieve a stable ion beam for subsequent implantation. Hence, the diluent portion of the plasma generated by the ion source maintains a selected pressure within the ion source 12 to allow various beam currents to be generated thereby. Those of ordinary skill will appreciate that the dopant and diluent gases can be intermingled within the ionization chamber or mixed prior to introduction to the ion source.

A drawback of conventional ion implantation systems is that conventional diluent gases, such as hydrogen, react with the dopant gas, such as phosphorous, during the ionization process which occurs internal to the ion source, as well as with any residue which is generated during use of the ion source and which coats the walls 18A of the ionization chamber 24. The residue which coats the ion source walls, as well as any reaction species formed by the reaction between the hydrogen and phosphorus (typical gases used for implantation), creates impurities which are subsequently implanted within the substrate S. For high dose implants, the impurities introduced to the substrate are generally within tolerable limits. For low dose implants, however, accuracy is of the utmost importance, and thus the generation of any impurities greatly affects the particular dose of ions implanted into the substrate S. Moreover, the presence of the impurities within the beam present significant obstacles to precisely controlling the dosage of the dopant ions implanted into the substrate.

One prior technique for ensuring the accuracy of the ion dose during low dose implant procedures is to dismantle the ion source and to clean any residue which may coat the chamber walls of the ion source, i.e., removing the source history. Although this technique removes the wall residue and thus eliminates the generation of any impurities created by the reaction between the diluent gas and the residue, it does not address the impurities created by the reaction between the gaseous forms of the dopant and the diluent. Hence, these impurities still form part of the ion beam, making it difficult to control the quantities of impurities implanted into the substrate. This control is particularly exacerbated during low dose implants since the impurities comprise a much larger percentage of the total beam current relative to high dose implants.

Moreover, dismantling and cleaning the ion source is rather lengthy and requires that the ion source be brought off-line of the ion implantation system, directly impacting the overall throughput of the system. This is generally undesirable, since a flexible ion implantation system that can be used for both high and low dose implant procedures would be advantageous.

The illustrated implantation system 10 is particularly suitable for implanting low doses of dopant ions into the substrate S. The illustrated diluent gas reservoir 28 introduces a noble gas, such as helium, into the implantation chamber by way of fluid conduits 32B and 30, rather than a conventional diluent such as hydrogen. The noble diluent gas is inert relative to the dopant gas, and thus does not substantially react with the dopant gas or with the residue that may coat the walls of the ionization chamber of the ion source 12. Additionally, the ion beam formed from ionizing the noble diluent gas and the dopant gas and emerging from the ion source does not introduce conductivity altering ions, or impurities, into the substrate S. Consequently, the dosage of the dopant ions implanted into the substrate can be precisely controlled, especially in low dose applications. Another advantage is that the system operator need not be concerned with the amounts of helium ions being implanted into the substrate, since these ions do not alter the electrical characteristics of the substrate.

The illustrated ion implantation system 10 of the present invention thus affords advantages which address the foregoing drawbacks of prior implantation systems. Significantly, the use of a noble diluent gas, such as helium, provides for an ion implantation system that can produce stable, highly accurate low dose implants. The illustrated system facilitates this by employing a noble diluent gas which does not react with the dopant gas, such as boron or phosphorous, nor with the residue coating the chamber walls 18A of the ion source. Moreover, since the noble diluent gas is inert relative to the dopant gas, implanting ions produced from the noble diluent gas does not alter the conductivity of the substrate, and thus does not create impurities which would affect the particular dosage to be applied to the substrate.

FIG. 2 is a tabular depiction illustrating the operation of the illustrated ion implantation system 10 employing a noble diluent gas. The table illustrates that the power source 22 provides a net forward RF power, in watts, to the energizing electrode 20. During the sample Runs 1 through 9, the flow of helium and phosphine ($PH_3$) into the ionization chamber were varied, and are designated in standard cubic centimeters per minute (sccm). The helium and phosphine flows set forth in the table are in nitrogen units. The resulting phosphine concentration within the ion beam 30 emerging from the ion source 12 is also set forth, and varies proportionally with the amount of phosphine introduced to the ionization chamber 24. The dopant fraction is the percentage of the ion beam 30 that consists of dopant ions, such as phosphorous ions. The ion beam current density, which is measured at 80 keV, varies directly with the net forward RF power supplied by the power source 22 to the energizing electrode 20. The dopant current is the product of the dopant fraction and beam current, and is also set forth within the table.

As illustrated in Run 1, the dopant gas reservoir did not introduce any dopant into the ionization chamber and the noble diluent gas reservoir had a helium flow of 72.3 SCCM. The resulting $PH_3$ concentration and dopant fraction were 0%. This result is significant since the presence of solely helium within the ionization chamber 24 did not produce any reaction species, and thus did not inter-react with any residue coating the walls 18A of the chamber 24. Consequently, the ion source 12 did not produce any significant quantities of impurities which may be implanted into a substrate. With further reference to Run 1, the beam current density was 252 microamps per centimeter, and the resultant dopant currentwas 0 micro amps per centimeter.

With reference to Run 3 of FIG. 2, the net forward RF power was 1248.4 watts, the helium flow was 71.5 SCCM, and the phosphine flow was 0.7 SCCM. The dopant and noble diluent gas flows resulted in a $PH_3$ concentration within the ionization chamber 24 of 0.98%. Correspondingly, the dopant fraction, which illustrates the percentage of phosphine ions within the ion beam generated by the ion source, was 1.6%. The beam current was slightly lower, since the power supplied by the power source was smaller, but the dopant current, which represents the beam current if comprised solely of dopant ions, was $200\mu$ Amperes (although the total ion beam current in this case is actually 12.5 m Amperes). This run illustrates that the dopant gas introduced into the ionization chamber 24 of the ion source 12 produced a corresponding amount of dopant ions. These ions constitute the sole contribution to the dopant current, since no additional impurities are being generated either by the reaction between the dopant and noble diluent gases, or between the noble diluent gas and the chamber residue.

The remaining Runs 4–9 introduced decreasing amounts of helium and increasing amounts of phosphine into the ionization chamber 24. Consequently, the resulting $PH_3$ concentration increased by a nearly corresponding portion. These runs also illustrate that no additional impurities are being generated either by the reaction between the dopant and noble diluent gases, or between the noble diluent gas and the chamber residue.

If the noble diluent gas (helium) were replaced with hydrogen, the resulting $PH_3$ concentration would look markedly different than that set forth in FIG. 2, especially if the ion source had a residue coating the walls 18A of the ionization chamber 24. More specifically, the resulting $PH_3$ concentration would be significantly greater than that set forth in the table since the hydrogen would react not only with the gaseous dopant present within the chamber 24, but also with the chamber residue. These reactions produce impurities that form part of the ion beam generated by the ion source 12. As previously described, these impurities interfere with the low dose application of ions into a substrate.

Figure 3:
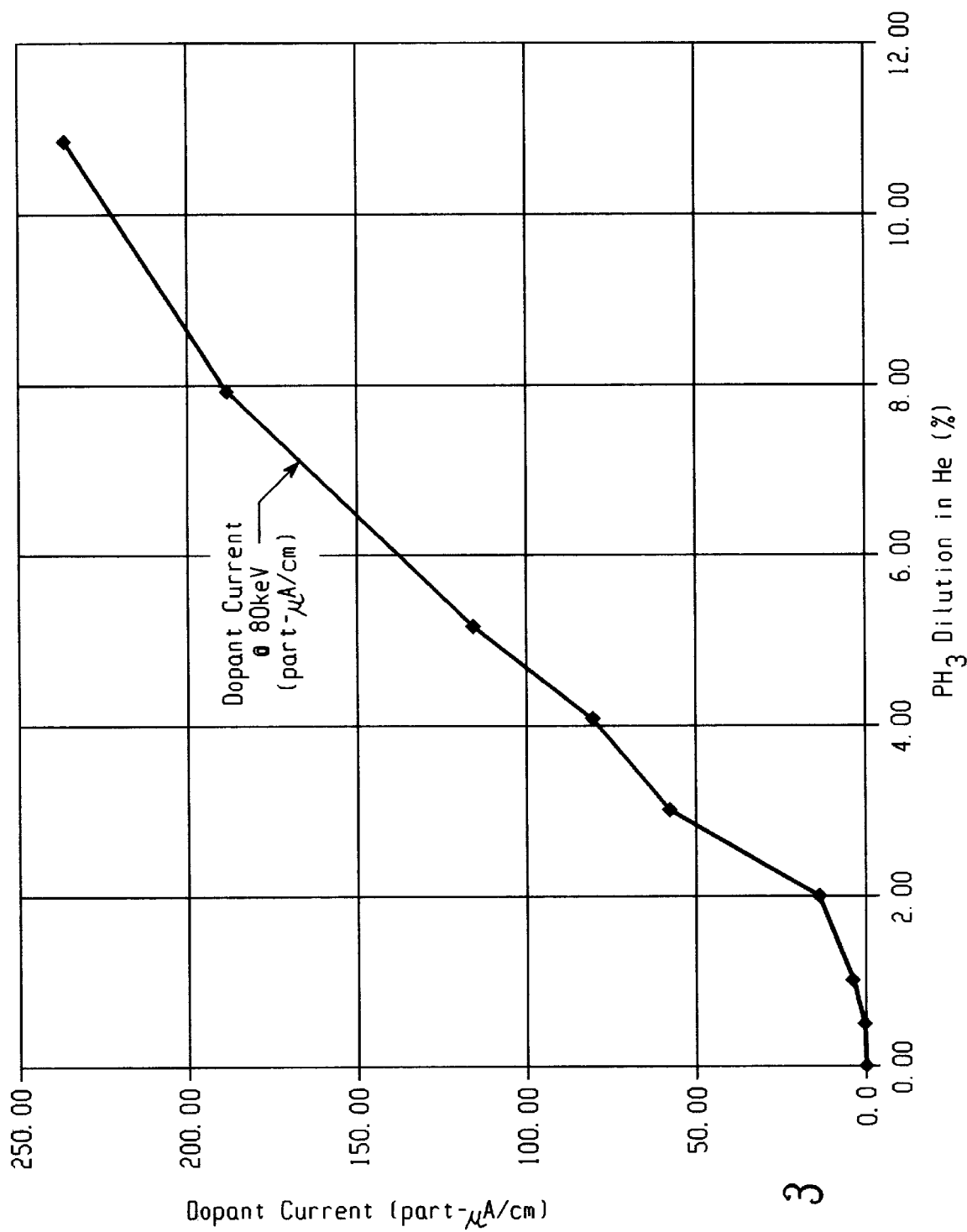
FIG. 3 is a chart of the results of FIG. 2 illustrating phosphine percentage along the abscissa axis and dopant current as the ordinate axis.

FIG. 3 is a graphical representation of the dopant current and the resulting $PH_3$ concentration set forth in the table of FIG. 2, where the $PH_3$ dilution in percent is illustrated along the abscissa axis and dopant current is illustrated along the ordinate axis. The relevant data is plotted in the illustrated Cartesian coordinate system. As is clearly illustrated by the graph, the concentration of dopant ions present in the ion beam increases with the concentration of dopant gas, especially when the net RF power is confined within a relatively narrow power range.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A method for ionizing a selected gas mixture in an ion source and for performing a low dose implant on a substrate, comprising the steps of introducing a dopant gas and a noble diluent gas which intermingles with the dopant gas into an ionization chamber of an ion source, the noble gas being inert relative to the selected gas, ionizing the dopant gas and the noble diluent gas, emitting an ion beam from the ion source, said ion beam including ions of both said dopant gas and noble diluent gases, implanting low doses of both the dopant ions and the diluent ions into the substrate, and controlling the dosage of said dopant ions during said low dose implant with said noble diluent gas.

2. The method of claim 1, wherein the step of introducing a noble diluent gas comprises the step of introducing helium into the ionization chamber.

3. The method of claim 1, further comprising the step of extracting dopant and diluent gas ions from the ionization chamber.

4. The method of claim 1, wherein said step of controlling further comprises the step of controlling the pressure of the ion source during implantation by adjusting the level of said noble diluent gas in the ionization chamber.

5. The method of claim 1, wherein said step of controlling further comprises the step of preventing the implantation of conductivity altering impurities into said substrate during said low dose implant.

6. The method of claim 1, wherein said step of controlling further comprises the step of controlling the level of dopant ions implanted into the substrate in the range between about $1\times10^{11}$ cm$^{-2}$ and about $1\times10^{16}$ cm$^{-2}$ by controlling the amount of noble diluent ions present in the ion beam emitted from the ion source during implantation.

7. The method of claim 6, wherein said step of controlling further comprises the step of controlling the level of dopant ions present in the ion beam during said low dose implant by introducing a selected amount of the noble diluent gas into the ionization chamber.

8. The method of claim 1, wherein said step of controlling further comprises the step of providing the noble diluent gas such that said gas is free of reaction with the dopant gas and with residue on an inner wall of the ion source, thereby allowing the implantation of relatively low doses of the ions into the substrate without introducing ions of any of said ion source residue into the substrate.

9. A method for implanting low doses of ions into a substrate, comprising the steps of introducing a dopant gas and a noble diluent gas into an ionization chamber of an ion source, the noble diluent gas being inert relative to the dopant gas, ionizing the selected dopant gas and the noble diluent gas when disposed in the ionization chamber to form dopant ions and diluent ions, implanting low doses of both the dopant ions and the diluent ions into the substrate, and controlling the dosage of said dopant ions during said low dose implant with said noble diluent gas, thereby implanting low doses of said dopant ions without introducing conductivity altering impurities other than said dopant ions into the substrate during said implant.

10. The method of claim 9, wherein the step of introducing the noble diluent gas comprises the step of introducing helium into the ionization chamber.

11. The method of claim 9, further comprising, prior to the step of implanting, placing the substrate within an implantation chamber of an implantation housing.

12. The method of claim 9, further comprising the step of operating the ion source regardless of source history.

13. The method of claim 9, wherein the ion source generates a beam current containing the dopant ions and the noble diluent ions, and wherein the step of implanting further comprises the step of implanting dopant ions in the range between $1\times10^{11}$ cm$^{-2}$ and about $1\times10^{16}$ cm$^{-2}$.

14. An ion implantation system for implanting low doses of ions into a substrate, the system comprising an ion source having an ionization chamber, an implantation housing coupled to the ion source and having an implantation chamber sized to house the substrate, one or more fluid reservoirs containing a noble diluent gas and a dopant gas, gas introduction means for introducing the dopant gas and the noble diluent gas into the ionization chamber, the noble diluent gas intermingling with the dopant gas therein, means for ionizing the dopant gas and the diluent gas when disposed within the ionization chamber to form energized ions, means for implanting low doses of the energized dopant ions and diluent ions into the substrate when positioned within the implantation chamber and in the path of the ions, and control means for controlling the dosage of said dopant ions with the noble diluent gas to achieve said low dose implant without introducing conductivity altering impurities other than said dopant ions into the substrate during said implant.

15. The system of claim 14, wherein the noble diluent gas comprises helium.

16. The system of claim 14, wherein the gas introduction means comprises fluid conduits coupled to the ion source and to the fluid reservoir for conveying the gas therebetween.

17. The system of claim 14, wherein the means for ionizing is coupled to the ion source and to a power source for supplying power to the electrode.

18. The system of claim 14, wherein the noble diluent gas is free of reaction with the dopant gas, thereby allowing the implantation of relatively low doses of the ions into the substrate.

19. A method for performing a low dose implant on a substrate, comprising the steps of introducing a dopant gas and a noble diluent gas which intermingles with the dopant gas into an ionization chamber of an ion source, the noble gas being inert relative to the selected gas, ionizing the dopant gas and the noble diluent gas, emitting an ion beam from the ion source, said ion beam including ions of said dopant and noble diluent gases, implanting low doses of the dopant ions and the diluent ions into the substrate, and stabilizing the ratio of dopant ions to the total number of ions in said ion beam to achieve accurate, stable low dose implants.

* * * * *